Sept. 6, 1966

E. M. MURAD 3,271,638

ENCASED SEMICONDUCTOR WITH HEAT CONDUCTIVE AND PROTECTIVE INSULATIVE ENCAPSULATION

Filed Nov. 4, 1963

INVENTOR
EMIL M. MURAD

BY [signature]

ATTORNEY

United States Patent Office 3,271,638

Patented Sept. 6, 1966

3,271,638

ENCASED SEMICONDUCTOR WITH HEAT CONDUCTIVE AND PROTECTIVE INSULATIVE ENCAPSULATION

Emil M. Murad, 4011 E. 1st St., Long Beach, Calif.

Filed Nov. 4, 1963, Ser. No. 323,190
1 Claim. (Cl. 317—234)

The present invention relates to semiconductor devices, such as rectifiers, transistors and the like, and to a method of making such devices, more particularly, though not limitatively, to devices designed for operation at elevated power levels and/or being liable to be subjected to bombardment by penetrative radiation, such as subatomic particles in the form of neutrons, alpha particles, beta particles and the like, or radiant energy in the form of gamma rays, X-rays, etc.

The present application is the same as my application 837,413 filed September 1, 1959 for Semiconductor Devices which was formally allowed on September 28, 1962 and which has become abandoned.

The present state of fabrication of high-power transistors and junction rectifiers according to the well-known alloying method involves the alloying of impurity pellets into a base semiconductor, such as germanium or silicon, and the fastening or affixing of the collector or output electrode by fusion onto a metal base or support, such as a copper screw, for connection to a larger metal chassis acting as a heat sink or radiator. As a result, the heat generated at the rectifier junction or the output (collector) electrode of the transistor flows with high conductance to a large thermal capacity source which equilibrates with the surrounding environment by convection due to flow of air over the metal surface and radiation. The same applies to semiconductor devices made by different methods, such as grown junction rectifiers, transistors, etc.

The connection of the output electrode to a heat sink is necessary for high power operation of transistors and the like semiconductor devices, since the nature of semiconductor materials dictates lowered resistivity with increasing temperature due to released charge carriers, and therefore the amplifying and rectifying action of devices fabricated from semiconductor materials is impaired significantly with increasing temperature. Thus, in order to preserve the transistor action for elevated power levels, it is mandatory that the heat generated at the output terminal of the device due to internal resistance, be removed instantly and efficiently.

Moreover, in the case of a transistor, the method of directly fastening the output electrode to the metal heat sink or chassis requires the use of large impurity pellets for the collector electrode which leads to high output capacitances and, in turn, prevents operation at elevated frequencies. Furthermore, where the metal heat sink is electrically as well as thermally connected to the output or collector electrode, the connecting of more than one transistor to the same chassis results in shortcircuiting of the collectors of transistors in multi-stage circuits, whereby operation will be impossible unless the circuit configuration is confined to common or grounded collector type.

Attempts to circumvent the foregoing difficulty by inserting an electrical insulator, such as a mica washer, between the metal base or fastener of the transistor and the heat sink or chassis lead to poor thermal contact and, in turn, to impaired operation at high power levels. As a consequence, the present state of the art of high power transistor fabrication has led to transistor housings as large or larger than miniature vacuum tubes, since high power operation and subminiature geometry have heretofore been of conflicting nature due to the use of large area junctions and the large diameter metal heat sinks required for efficient thermal transfer. The same considerations apply to junction rectifiers or diodes made according to the alloying or any other process such as the grown junction and diffusion methods and comprising a single PN junction in place of a plurality of such junctions, as in a semiconductive triode or tetrode transistor.

Accordingly, a principal object of the present invention is to preserve substantially the standard subminiature housing configuration for transistors and the like semiconductor devices, while assuring adequate heat dissipation or equilibration and, in turn, enabling operation of the devices at elevated power levels.

Another object of the invention is the provision of a transistor or the like semiconductor device suitable for operation at elevated power levels, substantially without necessitating an increase of the inherent output capacitance and, in turn, reduction of the upper operating frequency limit of the devices.

Yet another object of the invention is the provision of an improved construction of a multi-junction semiconductor device, such as a transistor or the like, whereby a number of devices may be connected to a single chassis or heat sink for operation at elevated power levels, substantially without the danger of short circuit of the electrodes and without impairing the thermal conductance or heat dissipation or transfer from the devices during operation.

Another object of the invention is to render possible the use of encapsulated subminiature semiconductor devices, such as transistors, rectifiers and the like, at high operating power levels and with low thermal gradients between the active junction regions of the devices and the outside surface of the housing enclosing the same, substantially without necessitating an increase in the device output capacitance, in an effort to preserve the maximum operating frequencies dictated by device geometry considerations and other intrinsic device characteristics, as well as to preserve and maintain the type of subminiature housing configuration well known and dictated by practical device fabrication.

A further object of the invention is to render possible the use of semiconductor devices, such as transistors, rectifiers and the like, for high operating power levels, while maintaining and preserving the type of subminiature housing configuration well known in and established by the art, substantially without having to resort to the well-known practice of electrically connecting one of the active electrodes, such as for example the collector electrode of a transistor, to the external housing or metal base of the device, to thus render it possible to connect any number of devices to the same heat sink or metal chassis without the use of separate insulators liable to impair or hinder thermal conductance from the active junction region of the device to the heat sink, or without involving the creation of electrical short circuits between any of the active electrodes of the devices so connected.

Semiconductors have been found to be a class of material whose electric properties are highly sensitive to crystal lattice imperfections caused by the bombardment of energetic subatomic particles or penetrative radiation, such as neutrons, protons, electrons, gamma rays, X-rays, etc. The defects thus produced in the semiconductor material may result in radical changes of the electric conductivity and other electric characteristics or properties of the material compared with metals, for example, where any such changes are subtle if at all recognizable by measurement. In addition to causing lattice imperfections in the semiconductor crystal, it has been found that bombardment of semiconductors by neutrons of thermal velocity may cause transmutation of the constituent atoms in the semiconductor crystal, thereby resulting in what may be termed nuclear "doping" of the material. Thus, as an example, germanium may become more strongly P-type as a result of thermal neutron capture, such for instance that the stable nucleides gallium 71 and arsenic 75 are produced to the extent of three percent and one percent of the integrated thermal flux, respectively. In the case of certain compound intermetallic semiconductors containing indium, for example in the form of indium antimonide, the effect of slow neutron bombardment on the electronic properties of the semiconductor may be even more drastic due to the high thermal neutron capture cross-section of the indium.

Whether the effect of penetrative radiation, such as neutrons, protons, beta particles or radiant energy, such as gamma rays or X-rays, on the semiconductive material is that of the production of imperfections in the crystal lattice, for example, in the form of vacancy sites, interstitial atoms or defect clusters, or that of nuclear transmutation of the atoms constituting the crystal lattice, the net result of such a disordered region or transmuted nucleus will be a change in the concentration of free charge carriers in the semiconductor. In the case of transmutation, it is easily seen that, after a neutron capture-gamma emission process by which, in the case of an elemental semiconductor, a group III or acceptor element may be produced substitutionally in the lattice from a group IV atom, the net effect will be one of either a compensation of the excess donor sites in the case of an n-type semiconductor or an increase in the excess acceptor sites in the case of a p-type semiconductor, respectively. In other words, in the case of an n-type semiconductor, the majority charge carrier concentration, that is, the electrons per cube centimeter, is decreased and the concentartion of minority charge carriers, that is, holes per cube centimeter is increased. Such changes may, for instance, deleteriously, if not fatally, affect the characteristics and operation of a transistor based primarily on the number and lifetime of injected minority charge carriers in the base region of the transistor.

Although the theoretical phenomena underlying the foregoing facts and results have not yet been fully investigated and ascertained and the explanations given herein are somewhat speculative, the results of experimental studies have been found to be reasonably consistent with the theoretical principles or considerations. Thus, the effect of radiation, whether in the form of a nuclear transmutation or a lattice disruption process, is to alter the net charge carrier concentration in the semiconductor, a property of primary significance in the determination of semiconductor device performance. Other effects caused by radiation of semiconductors by subatomic particles or radiant energy which may have important consequences on device performance are a marked reduction in minority charge carrier lifetime, probably resulting from an increase of recombination centers or a relaxation of the band transition selection rules due to lattice distortion and consequent enhancement of the excess carrier recombination rate, or due to a combination of both phenomena, all resulting in a degradation of device electrical parameters, such for instance as current gain in transistors, decrease of charge carrier mobility, the production of metastable minority charge carrier trapping centers, as well as other detrimental effects which may obtain, depending upon the particular semiconductor material, device geometry, as well as other characteristics and causes.

Accordingly, a further important object of the invention is the protection of a semiconductor device, such as a transistor, rectifier and the like, more particularly of its crystalline integrity, periodic structure and electronic properties against impairment by or damage due to bombardment by penetrative radiation, including both incident subatomic particles (neutrons, protons, beta particles, deuterons, etc.) and radiant energy (gamma rays, X-rays, etc.).

Still another object of the invention is to render possible the use of transistors, rectifiers and the like semiconductor devices under environmental conditions in which a high ambient flux of penetrative radiation exists, such as in close proximity to nuclear reactors or away from the protective cover of the earth's atmosphere in outer space, while maintaining and preserving the type of standard subminiature housing configuration well known in the art.

The invention, both as to its ancillary objects as well as novel aspects, will be better understood from the following detailed description taken in reference to the accompanying drawing forming part of this specification and wherein.

Figure 1:
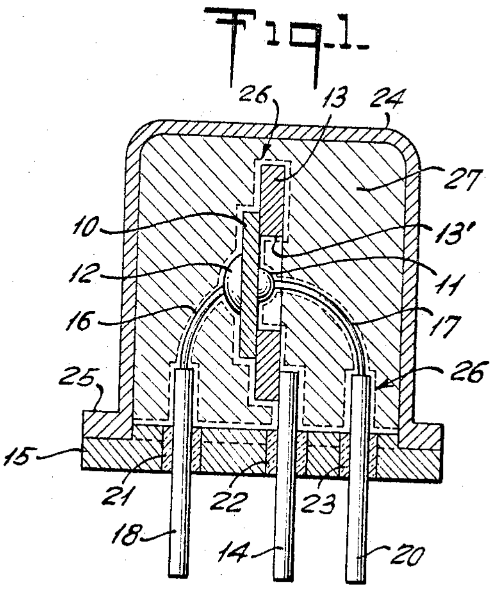
FIG. 1 shows, by way of example, a cross-sectional view of an alloyed junction transistor mounted in a hermetically sealed protective casing or encapsulant material in accordance with the principles of the invention.

While the invention will be described in the following with specific reference to a semiconductor triode or transistor, it is to be understood that the principles and improvements of hermetic encapsulation and heat dissipation, as well as radiation protection, according to the invention will apply with equal advantage to other semiconductor devices, such as diodes or rectifiers and the like devices having at least one PN junction formed by adjoining semiconductor regions of different conductivity type.

With the foregoing objects in view, the invention involves generally the encapsulation of a semiconductor device, as for example a transistor, rectifier and the like, with a fusible conducting eutectic metal alloy having a relatively low melting point and which may include a penetrative radiation absorbing or reducing component or moderator, so as not to damage by thermal energy the electronically active regions of the device or the mechanical supporting or mounting elements or both, after the electronically active areas or parts of the device have been protected by coating the same with a thin layer of an electrically insulating and high heat-conducting material, preferably a thermo-plastic substance including finely divided particles of a heat-conducting insulator.

Examples of fusible eutectic alloys which have been used successfully to encapsulate a germanium or silicon transistor or rectifier without damaging the electronically active regions or parts thereof, and which due to their constituent elements, such as lead and cadmium, impart a high degree of resistance to incident subatomic particles and radiant energy and which, in addition, provide a low thermal resistance between the active junction region of the device and the outside surface of the housing enclosing the device, to allow of high operating power levels, are the ternary alloy consisting of 52% bismuth, 40% of lead and 8% cadmium; the binary alloy consisting of 60% of bismuth and 40% of cadmium; the binary alloy consisting of 55% of bismuth and 45% lead; the binary alloy consisting of 75% indium and 25% cadmium; the binary alloy consisting of 68% bismuth and 32% indium; the ternary alloy consisting of 54% bismuth, 26% tin and 20% of cadmium; the ternary alloy consisting of 52% bismuth, 32% of lead and 16% of tin; and the quaternary alloy consisting of 50% bismuth, 27% lead, 13% tin and 10% of cadmium.

The choice of the alloy is, however, not limited to the above, as there exists a multitude of various combinations of tin, bismuth, lead, cadmium, antimony, mercury and indium which are known to produce fusible eutectic alloys. The alloy utilized in a specific application may be chosen from consideration of its physical properties, such as melting point, thermal conductivity, density, the type of semiconductor device to be encapsulated, the nature and spectra of the radiation to which the device will be subjected in use, as well as other considerations and design as well as operating requirements. Many of these alloys are available on the market, under such proprietary or trade names as "Ascarolo," "Corrolow," and many others.

Since a metal in intimate contact with the electrically active regions of a semiconductor device would result in a short circuit of the active elements of the device, it is necessary first to cover the device including both the electrically active elements and the mounting and terminal conductor means with a thin coating of an insulating material prior to the encapsulation by the fusible eutectic alloy. Such insulating materials may advantageously consist of a suitable synthetic resin sprayed on so as to produce a thin protective layer capable of efficient thermal transfer, but should have a softening point which is higher than the melting point of the encapsulant alloy. Since the surfaces of most semiconductor devices are highly sensitive to contamination by ions which may migrate to the junction regions and cause degradation of electrical characteristics, it has been found advantageous to use resins of the thermoplastic type which require no electrically active catalyst for setting or polymerization, in the interest of preserving device stability.

Furthermore, the resin must be dissolved in a low-boiling range solvent of high chemical purity so that the solvent may be driven off by heating the coated semiconductor device, such as by storage in an oven at 100 degrees C. for 24 hours, without damaging the active semiconductor elements by excessive heat and without contamination of the semiconductor surface by solvent residue. Since thermoplastic resins are by their very nature of synthesis and polymerization among the purest manufactured substances, the use of such materials in intimate contact with the surface of a semiconductor device and its mounting elements has been found feasible for electrical insulation from the alloy encapsulant and preservation of device stability. Furthermore, such resins may be filled with materials of high thermal conductivity, to lessen the thermal gradient between the body of the semiconductor device and the encapsulating alloy. Examples of such materials used as fillers in the resin are aluminum oxide and mica in the form of finely divided particles of a size of the order of about one micron.

Some examples of thermoplastic resins suitable for coating the semiconductor device according to the invention are polyvinyl butyral dissolved in reagent grade methanol, polydimethyl siloxane dissolved in reagent grade benzene and polyvinylidene chloride-acrylonitrile copolymer dissolved in reagent grade methyl ethyl ketone. Filler in the form of micron-sized particles of aluminum oxide or mica flour may be added to obtain approximately 80% filler by weight of the composite materials, whereby to produce a multiplicity of continuous thermal paths between the body of the semiconductor device and the alloy encapsulants. The resin may be sprayed onto the semiconductor device and the device dried so as to obtain a coating of approximately 0.0003 inch which has been found sufficient to protect the device and its electrically active elements from deterioration and electrically short-circuiting by the encapsulating alloy.

After the resin has been applied as described above, and the solvent driven off by thorough drying, the housing of the semiconductor device is filled with the alloy encapsulant held at a temperature of approximately 10 degrees C. above its melting point. The semiconductor device mounted on an appropriate header or base may then be immersed in the housing containing the molten alloy until the rim or outer edge of the header assembly is in contact with the rim or outer edge of the housing. After solidification of the alloy, the device may be hermetically sealed by ring welding of the entire assembly, in a manner further described in reference to the drawing.

In this manner, the device housing is used as a mold for the encapsulating alloy, the space within said housing being entirely filled with the alloy except for the semiconductor device itself, its electrically active elements and mounting means including the coating of insulating material applied prior to encapsulation.

According to an alternative method of assembly and fabrication, a housing provided with a open-ended exhaust tube is ring welded to the header or base on which is mounted the semiconductor device with its associated supporting and terminal means, a conventional procedure being widely practiced for the encapsulation of electrical devices in the art. However, prior to this welding operation, the semiconductor body of the device including its electrically active areas and associated elements is coated with a thin layer of insulating material, as described in connection with the preceding embodiment. The device is then placed in a vacuum oven over an open container holding the molten encapsulant so that the tubulation is in a vertical position with the open end above the surface of the molten material. After evacuation, and preferably after equilibration of the pressure within the vacuum system, the device is lowered by mechanical means so that the open end of the exhaust tube is immersed in the molten encapsulant sufficiently to allow for continued immersion after release of the vacuum in the oven and consequent depletion of the encapsulant due to filling of the housing with the encapsulating alloy. The oven heater may then be turned off and the encapsulated device allowed to cool with consequent solidification of the alloy, or the device may be removed carefully from the oven with the alloy still in molten condition and allowed to cool thereafter. Sufficient restriction of the tube diameter will prevent outflow of the molten alloy due to surface tension. The exhaust tube may be sealed off by welding or any other manner well known.

While the above described methods are illustrative of the application of the principles of the invention, numerous other arrangements and methods will suggest themselves to those skilled in the art. Furthermore, the invention may be practiced with equal results and advantage in connection with transistors and the like devices made in accordance with any of the known methods and comprising one or more PN junctions produced by an alloying, grown junction, diffusion, or the like method known.

The intimate thermal contact or heat-conducting path established between the body of the semiconductor device and its housing by encapsulation by the fusible eutectic alloy, in accordance with the present invention, results in a significant increase of the upper limit of the operating power level of the device. As an example, a fused alloy germanium transistor hermetically sealed by conventional methods, which has been found to exhibit a thermal gradient of approximately 0.3 degrees C. per milliwatt of power dissipation, was found to exhibit a thermal gradient of approximately 0.1 degrees per milliwatt upon encapsulation in a eutectic alloy in accordance with the present invention. These data apply to free air at 25 degrees C. Consequently, if the maximum permissible junction temperature for the device is 85 degrees C., the maximum power dissipation will be raised from say 200 milliwatts to 600 milliwatts in free air. Maximum permissible power levels of operation may be further increased by connecting the housing to a heat sink through a metal tab or projection which may be fabricated as a part of the device housing. Since the device electrodes are electrically insulated from the external housing, any number of transistors or equivalent semiconductor devices may now be connected to the same chassis or heat sink, without impairing the thermal transfer or short-circuiting of the output electrodes of the devices.

Referring more particularly to the drawings, FIG. 1, there is shown a fused alloy junction transistor of known construction comprising a semiconductor base 10 which for the purpose of illustration may be assumed to be a single crystal of n-type germanium (in the case of a P-N-P transistor) and to the opposite sides of which have been fused indium dots 11 and 12 forming the emitter and collector elements, respectively, of the transistor, the base 10 being, in turn, fused or otherwise connected to a metal tab or support 13 provided with a hole or recess 13' to accommodate the emitter 11, in the example illustrated. The tab 13 may have been previously tinned for this purpose, to effect a fusion with the semiconductor element 10, in a manner well known and understood. The tab is, in turn, connected to the terminal electrode or pin 14 being insulatingly mounted in a header or metal base 15, for example, by spot welding, while metal wires or leads 16 and 17 are joined to the collector and emitter electrodes 12 and 11, on the one hand, and to a further pair of terminal pins 18 and 20, respectively, also being insulatingly mounted in the base 15, on the other hand. Joined to the base 15 in any suitable manner, as by welding etc., is a protective cap or metal casing 24 having a flange 25 fitting in a peripheral groove of said base, to hermetically seal the transistor or the like semiconductor device.

Electrical isolation of the various terminal electrodes and semiconductor elements or electrodes is thus effected by the insulating such as metal-to-glass seals 21, 22 and 23 in the base or header 15. Any other mounting and sealing arrangement may be used for the purpose of the present invention, as will be apparent and understood from the foregoing.

In manufacture, after the semiconductor elements 10, 11 and 12 have been assembled and mounted upon the header 15 in the manner described, all the electrically active and mechanical supporting parts of the assembly are coated with thin layer 26 of an electrical insulator, for example, mica-filled polyvinyl butyral being cured or polymerized by baking, preferably in a vacuum, to completely drive off the solvent, in the manner described hereinabove. The header assembly is then introduced into the container 24 which may previously have been filled with the fusible eutectic alloy 27 and the container is then joined to the base 15 by electric welding, cold welding or in any other suitable manner.

Figures 2, 3:
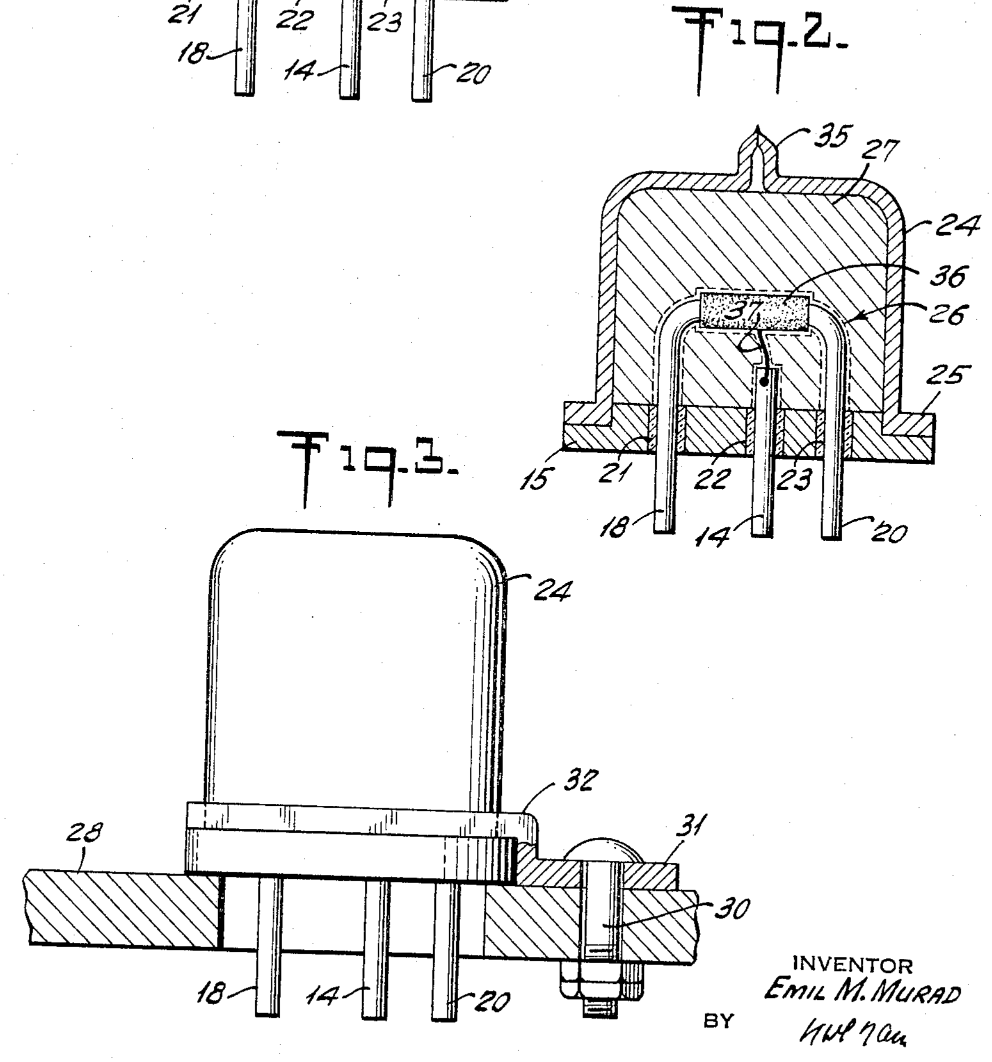
FIG. 2 is a similar cross section illustrating a grown junction type transistor and embodying the improvements of the invention.
FIG. 3 is an elevation of the completed transistor according to FIGS. 1 and 2 shown mounted upon a metal chassis or heat sink.

Alternatively, the casing or cap 24 may be provided with an exhaust or filling tube 35, FIG. 2, whereupon the assembly is evacuated and the space within the casing filled by pressure with a suitable encapsulant of the type described, with or without certain types of inert atmospheres, such as nitrogen or helium. After filling or impregnation, the tube 35 may be sealed off by spot welding, cold or pinch sealing, or in any other suitable manner.

In FIG. 2, there is shown a grown junction type transistor comprising a crystal element 36 having the usual emitter, base and collector regions, the emitter and collector being shown directly connected to the terminal pins or prongs 18 and 20 and the base being connected to the terminal 14 through a separate connecting lead 37.

If desired, the completed transistor may be mounted upon a metal chassis or heat sink 28, FIG. 3, in any suitable manner, such as by means of a screw or bolt 30 firmly securing the extension or tongue 31 of a metal mounting ring 32, welded or otherwise connected to the casing 24, against said support or chassis, in the manner shown by and understood from the drawing.

While a transistor has been shown in the drawing for illustration, the encapsulating technique described may be used with equal advantage in connection with the fabrication of semiconductor rectifiers or diodes or any other P-N junction type of semiconductor devices involving substantial internal heat generation and requiring means to dissipate efficiently or transfer the heat generated, and/or devices liable to be subjected to penetrative radiation, as described hereinabove.

According to a modification of the invention, the casing 24 may be omitted and the semiconductor and its supporting elements encased in an enclosure of the eutectic alloy by the use of a separate mold and the techniques well known in connection with the molding of other electrical devices. In this case, the encapsulant alloy acts both as a casing for the semiconductor device, as well as a heat dissipating and/or radiation protecting means.

In the foregoing the invention has been described with reference to a specific illustrative device. It will be evident, however, that variations and modifications, as well as the substitution of equivalent parts or materials for those mentioned and shown may be made without departing from the broader scope and spirit of the invention as set forth in the appended claim. The specification and drawings are accordingly to be regarded in an illustrative rather than in a limiting sense.

I claim:

A semiconductor device comprising an element of semiconductor material including at least two regions of different conductivity type forming a PN junction, supporting means for said element, a metallic casing hermetically enclosing said element and electrical terminal means insulatingly mounted in said casing and connecting said regions of different conductivity with the outside of said casing; the improvement consisting in the provision of heat-conducting insulating layer directly upon said element, said supporting means and the portions of said terminal means located within said casing, and a solid body of heat-conducting and neutron and gamma ray absorbing encapsulant consisting of a eutectic alloy having a melting point lower than both the softening point of said insulating layer and the critical temperature substantially affecting irreversibly the electrical operating characteristics of said semiconductor material, said body completely filling the space enclosed by said layer and the inside of said casing, to provide a continuous thermal conducting path from said element to said casing, said insulating layer consisting of a thermoplastic resin containing a finely divided filler of high thermal conductivity, said filler consisting of about 80% by weight of micron-sized particles of mica.

No references cited.

JOHN W. HUCKERT, *Primary Examiner.*

J. D. KALLAM, *Assistant Examiner.*